United States Patent
Ward et al.

(10) Patent No.: US 7,612,447 B2
(45) Date of Patent: Nov. 3, 2009

(54) SEMICONDUCTOR DEVICES WITH LAYERS HAVING EXTENDED PERIMETERS FOR IMPROVED COOLING AND METHODS FOR COOLING SEMICONDUCTOR DEVICES

(75) Inventors: Terence G. Ward, Redondo Beach, CA (US); Edward P. Yankoski, Corona, CA (US)

(73) Assignee: GM Global Technology Operations, Inc., Detroit, MI (US)

(*) Notice: Subject to any disclaimer, the term of this patent is extended or adjusted under 35 U.S.C. 154(b) by 139 days.

(21) Appl. No.: 11/758,833

(22) Filed: Jun. 6, 2007

(65) Prior Publication Data

US 2008/0303137 A1    Dec. 11, 2008

(51) Int. Cl.
*H01L 23/34* (2006.01)
*H01L 23/52* (2006.01)

(52) U.S. Cl. .............. 257/712; 257/714; 257/E23.098; 257/E23.097; 257/E23.08

(58) Field of Classification Search ........... 257/712, 257/714, E23.1, E23.109, E23.022, E23.093
See application file for complete search history.

(56) References Cited

U.S. PATENT DOCUMENTS

| | | | | |
|---|---|---|---|---|
| 5,021,924 A | * | 6/1991 | Kieda et al. | 361/699 |
| 5,895,974 A | * | 4/1999 | Eytcheson et al. | 257/723 |
| 2003/0022464 A1 | * | 1/2003 | Hirano et al. | 438/460 |
| 2006/0006506 A1 | * | 1/2006 | Watanabe et al. | 257/666 |
| 2008/0101013 A1 | * | 5/2008 | Nelson et al. | 361/689 |

* cited by examiner

*Primary Examiner*—Evan Pert
*Assistant Examiner*—William Harriston

(57) ABSTRACT

A semiconductor device is provided, and includes a wafer having first and second opposed metallized major faces and a transistor bonded to the first metallized face of the wafer. The transistor includes a first surface, and the first surface defines a first area. The device further includes a first metal layer bonded to the first surface of the transistor. The first metal layer has a first surface that defines a second area larger than the first area of the transistor. The device further includes a ceramic layer bonded to the first surface of the first metal layer.

20 Claims, 5 Drawing Sheets

SEMICONDUCTOR DEVICES WITH LAYERS HAVING EXTENDED PERIMETERS FOR IMPROVED COOLING AND METHODS FOR COOLING SEMICONDUCTOR DEVICES

TECHNICAL FIELD

The present invention relates to semiconductor devices with layers having extended perimeters. More particularly, the present invention relates to semiconductor devices with extended perimeters for improved cooling by liquid cooling systems in semiconductor modules and methods for cooling semiconductor devices.

BACKGROUND OF THE INVENTION

Certain semiconductor devices are known to generate excess heat during operation. This is especially true for power semiconductor devices, which are commonly utilized as switches or rectifiers in high-power electric circuits. Power inverters, for example, are used in electric and hybrid electric vehicles to provide three phase operating power to the electric drive motor of the vehicle. Power inverters and other such devices must typically be cooled to ensure proper functioning. For this reason, the power modules that house such power devices are often provided with some form of cooling system. For example, conventional cooling systems commonly employ a cold plate (e.g., a heat sink) to transfer heat away from the power device. The heat sink may comprise a metal body (e.g., aluminum, copper, etc.) having a flat surface and a plurality of projections ("pin-fins") extending away therefrom. The flat surface of the heat sink is placed in thermal contact with the power device (e.g., soldered to a substrate supporting the power device), and the pin-fins are exposed to a cooling source, typically air or a coolant fluid (e.g., glycol water). One liquid cooling system utilizes a pump to circulate coolant fluid over and onto the top portion of power device. During device operation, heat is conducted away from the power device and into the pin-fins, which are convectively cooled by the cooling source.

Conventional semiconductor devices may not achieve optimal cooling in the cooling systems described above. Typically, much of the heat of the semiconductor devices is generated by the semiconductor component itself. In an insulated gate bipolar transistor (IGBT) device that is utilized as a power device, the transistor may generate most of the heat in the device (e.g., switching and conduction losses). In such a device, however, the transistor may not be effectively cooled by the liquid coolant because the liquid coolant must conduct heat away from the device through a number of intervening layers positioned over the transistor, for example, interconnects and insulating layers.

Accordingly, it is desirable to provide a semiconductor device that enables more efficient cooling with a liquid cooling system. Moreover, it is also desirable to provide a semiconductor module that includes a semiconductor device and a liquid cooling system that effectively cools the semiconductor device. In addition, it is desirable to provide a method of cooling a semiconductor device with a liquid cooling system that is more efficient than conventional methods. Other desirable features and characteristics of the present invention will become apparent from the subsequent detailed description and the appended claims, taken in conjunction with the accompanying drawings and the foregoing technical field and background.

SUMMARY OF THE INVENTION

In accordance with one exemplary embodiment, a semiconductor device is provided, and includes a wafer having first and second opposed metallized major faces and a transistor bonded to the first metallized face of the wafer. The transistor includes a first surface, and the first surface defines a first area. The device further includes a first metal layer bonded to the first surface of the transistor. The first metal layer has a first surface that defines a second area larger than the first area of the transistor. The device further includes a ceramic layer bonded to the first surface of the first metal layer.

In accordance with another exemplary embodiment, a semiconductor module is provided, and includes a housing having a cavity therein and at least one semiconductor device residing within the cavity. The at least one semiconductor device includes a wafer having first and second opposed metallized major faces; a transistor bonded to the first metallized face of the wafer and having a first surface defining a first area; a first metal layer bonded to the first surface of the transistor and having a first surface that defines a second area larger than the first area of the transistor; a ceramic layer bonded to the first metal layer; and a cooling system. The cooling system includes a flow passageway through the housing and fluidly coupled to the cavity, and the cooling system is configured to circulate a coolant fluid through said flow passageway and in contact with the first metal layer of the at least one semiconductor device.

In accordance with yet another exemplary embodiment, a method for cooling a semiconductor device is provided, and includes the steps of: circulating a coolant fluid through a flow passageway; directing the coolant fluid onto a first metal layer of the semiconductor device, the first metal layer bonded to a transistor in the semiconductor device; and collecting the coolant fluid and recirculating the coolant fluid through the flow passageway.

DESCRIPTION OF THE DRAWINGS

The present invention will hereinafter be described in conjunction with the following drawing figures, wherein like numerals denote like elements, and wherein.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
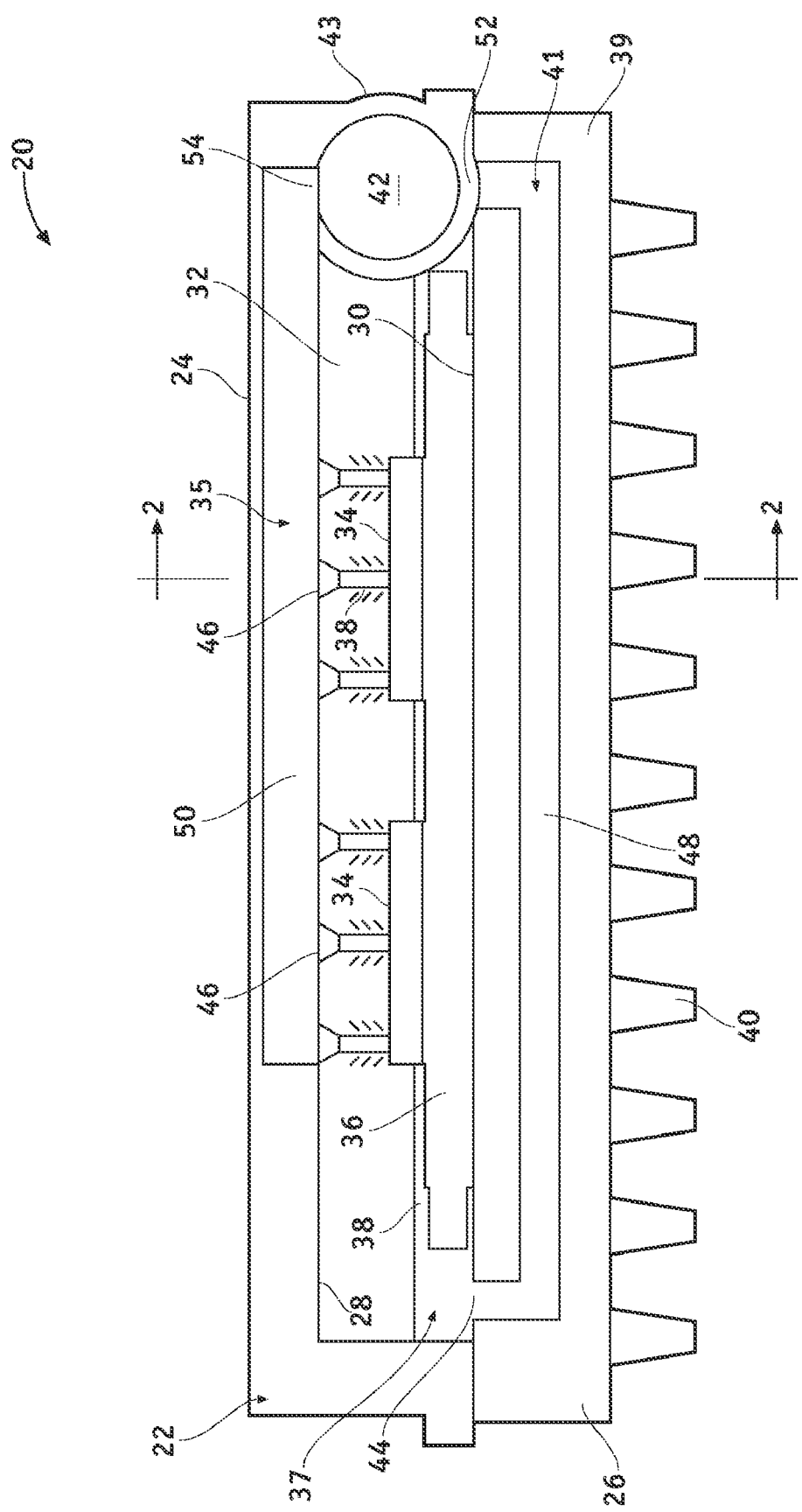
FIG. 1 is a first cross-sectional view of a semiconductor module in accordance with an exemplary embodiment of the present invention.
Figure 2:
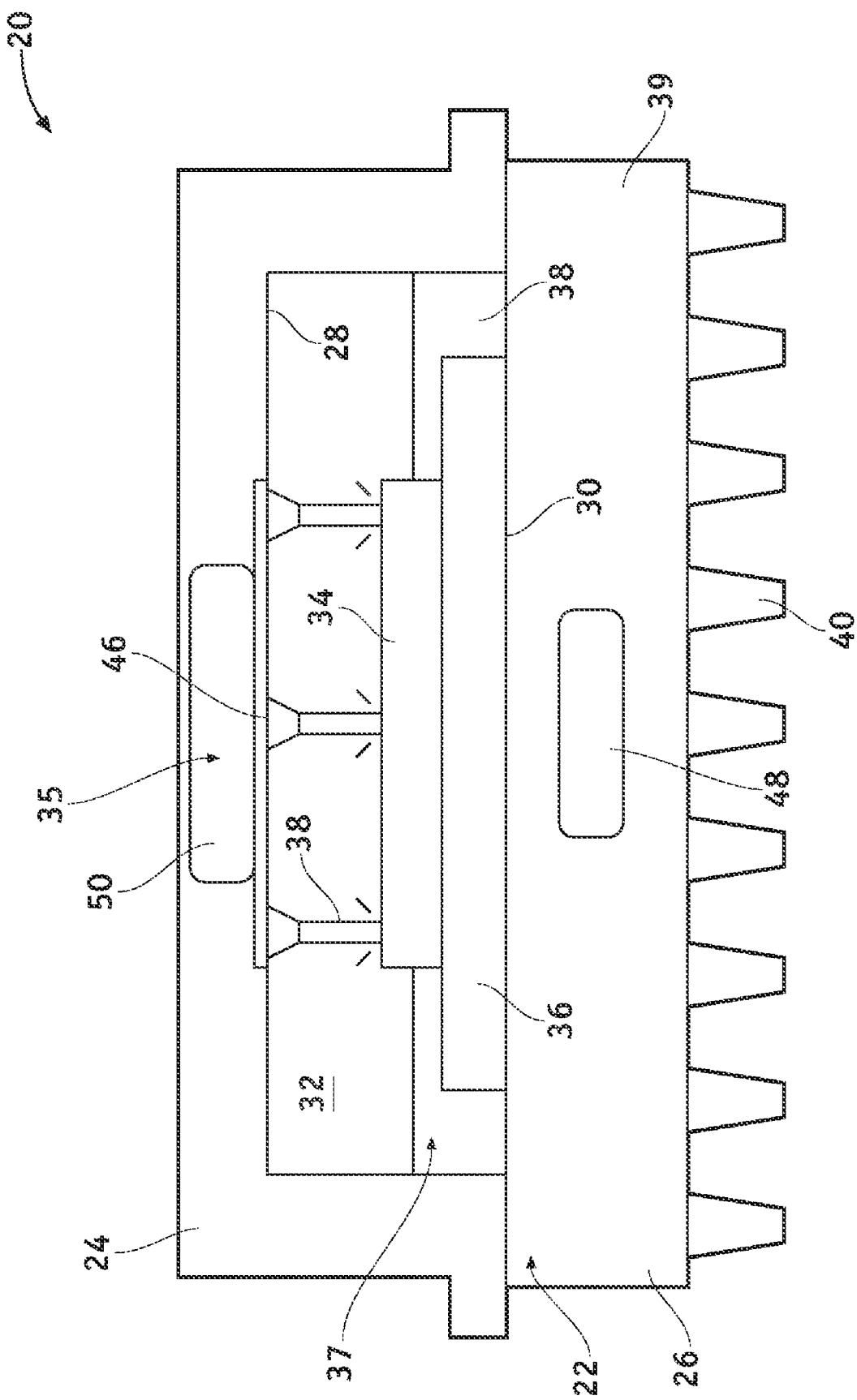
FIG. 2 is a second cross-sectional view of the semiconductor module shown in FIG. 1 taken along plane 2-2.

FIG. 1 is a first cross-sectional view of a semiconductor module 20 in accordance with an exemplary embodiment of the present invention, and FIG. 2 is a second cross-sectional view of the semiconductor module 20 taken along plane 2-2 in FIG. 1. The semiconductor module 20 may be a power module (e.g., an inverter module) suitable for deployment on an electric or hybrid vehicle. The semiconductor module 20 can be utilized in an electric, hybrid or fuel cell automobile, for example, with a three-phase, alternating current (AC) electric motor. The semiconductor module 20 can be an inverter circuit that supplies switched alternating current to the AC electric motor.

The semiconductor module 20 comprises a housing 22, which, in turn, comprises a module cover 24 and a base 26. The base 26 may comprise, for example, a cold plate and is referred to herein as such. The term cold plate is used herein in its broadest sense and encompasses any device (e.g., a heat sink) suitable for removing heat from semiconductor module 20. The cover 24 may be fabricated from a thermally non-conducting material, for example, molded from a suitable polymer such as plastic, and cold plate 26 may be constructed from a thermally conductive metal such as, for example, aluminum or copper. The cover 24 includes an inner surface 28, and the cold plate 26 includes a support surface 30. The cover 24 is sealingly coupled to the cold plate 26 such that the inner surface 28 and the support surface 30 cooperate to define a cavity 32 within the housing 22. As will be appreciated by one skilled in the art, the cover 24 may be sealingly coupled to the cold plate 26 in a variety of manners. For example, the cover 24 may be coupled to the cold plate 26 via an adhesive or a plurality of fasteners. Alternatively, the cover 24 may be molded to include a plurality of mechanical locking features that engage the support surface 30, or the cover 24 may simply be molded directly onto cold plate 26. If fasteners or mechanical locking features are utilized, an elastomer O-ring (not shown) may be disposed between the inner surface 28 and the support surface 30 to ensure that a liquid and vapor tight seal is formed between the cover 24 and the cold plate 26.

One or more semiconductor devices 34 (e.g., power devices, such as inverters having transistors) are disposed within the cavity 32 and coupled to the support surface 30 of the cold plate 26. The semiconductor devices 34 are illustrated schematically in FIGS. 1 and 2, and are described in further detail in reference to FIGS. 3-5. The semiconductor devices 34 can be, for example, insulated gate bipolar transistors (IGBTs). IGBTs are semiconductor devices particularly suitable for use in power applications. IGBTs handle both high voltages and high currents with small die sizes and with relatively low "on" resistance. In addition, IGBTs can be switched rapidly, thereby making IGBTs useful as switches in three phase inverters for high power, alternating current motor applications, such as motors used to drive electric, hybrid and fuel cell vehicles.

The semiconductor devices 34 are supported by and fixedly coupled to a substrate 36. The substrate 36 may be a direct-bonded copper substrate (e.g., a copper-laminated aluminum oxide or ceramic substrate), and the semiconductor devices 34 may be soldered to the substrate 36; however, it should be appreciated that other substrates and attachment means may be utilized. The substrate 36 is thermally coupled to (e.g., soldered to) the support surface 30 thereby placing the semiconductor devices 34 in thermal communication with the cold plate 26.

During operation of the semiconductor module 20, heat is generated by the semiconductor devices 34. In particular, heat is produced by electrical components (e.g., power switches, diodes, etc.) employed by semiconductor devices 34. A cooling system 35 is consequently provided within the housing 22 to dissipate the heat produced by the semiconductor devices 34 by actively circulating a coolant fluid 38 through the housing 22 and over or onto the semiconductor devices 34. As described in more detail below, the cooling system 35 preferably directs one or more fluid streams or atomized sprays of coolant fluid directly onto top surfaces of semiconductor devices 34 to cool the semiconductor devices 34.

The coolant fluid 38 is preferably a dielectric liquid. As will be apparent to one skilled in the art, the particular dielectric liquid selected will depend upon device chemistry and application. Suitable dielectric liquids may include, but are not limited to, fluorocarbons, silicone oils, and polyalphaolephins. The coolant fluid 38 collects within a coolant fluid reservoir 37, which is disposed within the cavity 32 and which is generally defined by the support surface 30 and the inner surface 28. As illustrated, the coolant fluid reservoir 37 may partially or fully envelop one or more of semiconductor devices 34; however, it should be understood that it is by no means necessary that the coolant fluid 38 contained within the coolant fluid reservoir 37 contact any portion of the semiconductor devices 34. Indeed, it may be preferable that surfaces of the semiconductor devices 34 are exposed so as to permit direct impingement of the coolant fluid 38 thereon from impingement outlets 46 of the cooling system 35, as discussed in greater detail below. In other embodiments, the semiconductor devices 34 may be entirely submerged by the coolant fluid 38, which may substantially fill the cavity 32. Embodiments of this type may provide improved thermal performance and/or decreased sensitivity to device orientation; e.g., a decreased possibility of gas ingestion by a pump (e.g., pump 42 described below) disposed within the semiconductor module 20 when the semiconductor module 20 is at an incline or when the semiconductor module 20 experiences centrifugal forces, or other gravity or acceleration forces.

In the exemplary embodiment, the cold plate 26 comprises a heat sink having a body portion 39 including the support surface 30. A plurality of projections 40 ("pin-fins") is coupled to or integrally formed with the body portion 39 and extends away therefrom substantially opposite the support surface 30. The pin-fins 40 increase the surface area of the lower portion of the cold plate 26 and thus promote the convective cooling of the cold plate 26. The pin-fins 40 are exposed to a cooling source in the well-known manner; e.g., the pin-fins 40 may be exposed to an air source, which may be directed over pin-fins 40 by a fan (not shown). Alternatively, the pin-fins 40 may be exposed to a second liquid coolant (e.g., glycol water). In this manner, the cold plate 26 cooperates with the substrate 36 to form a conductive heat dissipation path. That is, excess heat generated by the semiconductor devices 34 is conductively absorbed by the substrate 36 and travels through the body portion 39 into the pin-fins 40. The cooling source applied to the pin-fins 40 then convectively dissipates the excess heat thereby cooling the cold plate 26.

As stated previously, the coolant fluid 38 is actively circulated through the housing 22 by cooling system 35 contained within semiconductor module 20. This cooling system 35 comprises a flow passageway 41 (FIG. 1) through the housing 22 having an inlet and at least one outlet. Additionally, the cooling system may further comprise a pump 42 (FIG. 1) fluidly coupled to the flow passageway 41. In the illustrated embodiment, the flow passageway 41 includes a reservoir inlet 44 disposed through the support surface 30 and a plurality of impingement outlets 46 disposed through the inner surface 28. The impingement outlets 46 are preferably positioned so as to direct the circulating coolant fluid 38 onto the semiconductor devices 34. A grouping of the impingement outlets 46 may be disposed substantially above a different one of semiconductor devices 34 as shown in FIGS. 1 and 2. In one exemplary embodiment, five impingement outlets 46 are provided for each semiconductor device 34, which one impingement outlet 46 for side corner and one impingement outlet 46 provided for the center. In an alternate embodiment, the impingement outlets 46 can be arranged at the corners of the semiconductor devices 34. The impingement outlets 46 may assume any form suitable for directing the coolant fluid 38 onto the semiconductor device 34. For example, the impingement outlets 46 may each take the form of one or more holes created through the inner surface 28 of the cover 24. However, the impingement outlets 46 each preferably comprise a fluid flow jet (illustrated) configured to create a stream of coolant fluid 38, or a spray nozzle configured to produce a fine or atomized mist. A particular module may employ fluid flow jets, spray nozzles, or a combination of jets and nozzles depending upon desired performance characteristics. Relative to fluid flow jets, spray nozzles tend to provide more efficient thermal cooling. Conversely, fluid flow jets help to preserve coolant fluid quality and may permit the pump 42 to be of the low pressure variety thereby reducing cost and increasing system reliability.

Although only one flow passageway 41 is shown in FIGS. 1 and 2, it should be appreciated that certain embodiments of the semiconductor module 20 may include multiple (e.g., dual) flow passages. The flow passageway 41 is preferably formed through a peripheral portion of the cold plate 26 so as to substantially avoid direct exposure to the conductive heat path provided through the substrate 36 and the cold plate 26. Additionally, it will be understood by one skilled in the art that the portion of the flow passageway (or passageways) 41 formed through the cold plate 26 may assume a variety of shapes and configurations (e.g., a serpentine or lattice configuration) to increase the length of the flow passage and, therefore, to maximize heat transfer from the coolant fluid 38 to the cold plate 26.

Referring still to the exemplary semiconductor module 20, the flow passageway 41 comprises two flow passage sections: a first flow passage section 48 formed through cold plate 26, and a second flow passage section 50 formed through cover 24 (e.g., through a top portion of cover 24). The first flow passage section 48 includes the reservoir inlet 44, and the second flow passage section 50 includes the plurality of impingement outlets 46. The pump 42 is disposed within the housing 22 and fluidly coupled between the first flow passage section 48 and the second flow passage section 50. For example, the pump 42 may reside within a peripheral portion 43 (FIG. 1) of the cover 24, and be fluidly coupled between an outlet 52 of the first flow passage section 48 and an inlet 54 of the second flow passage section 50. When energized, the pump 42 circulates the coolant fluid 38 through the flow passageway 41 and over the semiconductor devices 34. More specifically, under the influence of the pump 42, the coolant fluid 38 is first drawn from the coolant fluid reservoir 37 into the reservoir inlet 44 of the first flow passage section 48. The coolant fluid 38 then flows through the first flow passage section 48 and into the pump 42. Next, the pump 42 expels the coolant fluid 38 into the second flow passage section 50. The expelled coolant fluid 38 flows through the second flow passage section 50 until reaching the impingement outlets 46, which then direct the coolant fluid 38 onto the semiconductor devices 34. After impinging the semiconductor devices 34, the coolant fluid 38 returns to the coolant fluid reservoir 37 and the cycle is repeated.

When the coolant fluid 38 impinges upon the semiconductor devices 34, heat is transferred from the semiconductor devices 34 to the coolant fluid 38 thus providing a convective heat dissipation path. This results in heat transfer from the semiconductor devices 34 to the coolant fluid 38. In a heated condition, the coolant fluid 38 flows into the coolant fluid reservoir 37 and is ultimately drawn into the reservoir inlet 44. As the heated coolant fluid 38 flows through the first flow passage section 48, the cold plate 26 causes the coolant fluid 38 to cool in the manner described above. As shown in FIG. 1, the first flow passage section 48 preferably spans the majority of the length of the cold plate 26 to maximize heat dissipation. Furthermore, as shown in FIG. 2, the width of the first flow passage section 48 is preferably substantially less than that of the cold plate 26 to increase heat dissipation along the conductive path described above.

Although FIGS. 1 and 2 illustrate the cooling system within the housing 22, portions of the cooling system 35 may reside outside of the housing 22. For example, the pump 42 and/or the cold plate 26 may be outside of the housing 22. Moreover, the heated coolant fluid 38 can be collected in a reservoir outside of the housing 22. In another embodiment, the coolant fluid 38 does not collect in the coolant fluid reservoir 37. Instead, the coolant fluid 38 changes phase into a vapor after being sprayed onto the higher temperature semiconductor devices 34. The vapor can rise to a cold plate on the top inner surface 28 of the housing, where the vapor condenses back into the coolant fluid 38 and flows back into the flow passageway 41. Alternatively, the vapor can be directed out of the housing 22, and into a cold plate or other heat exchanger that condenses the vapor into the coolant fluid 38 and directs the coolant fluid 38 back into the flow passageway 41.

Figure 3:
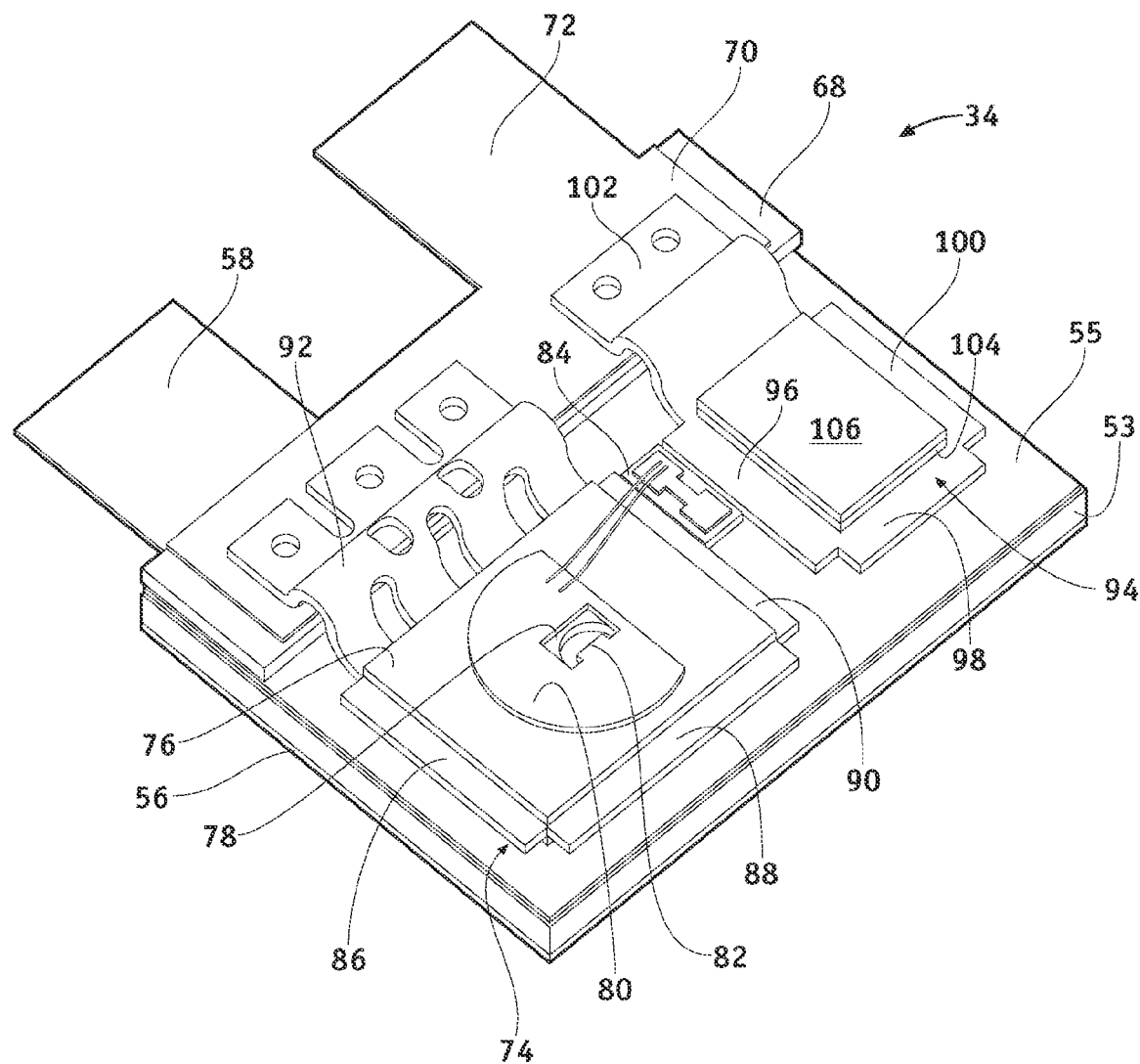
FIG. 3 is an isometric view of an exemplary embodiment of the semiconductor device utilized in the semiconductor module of FIGS. 1 and 2.
Figure 4:
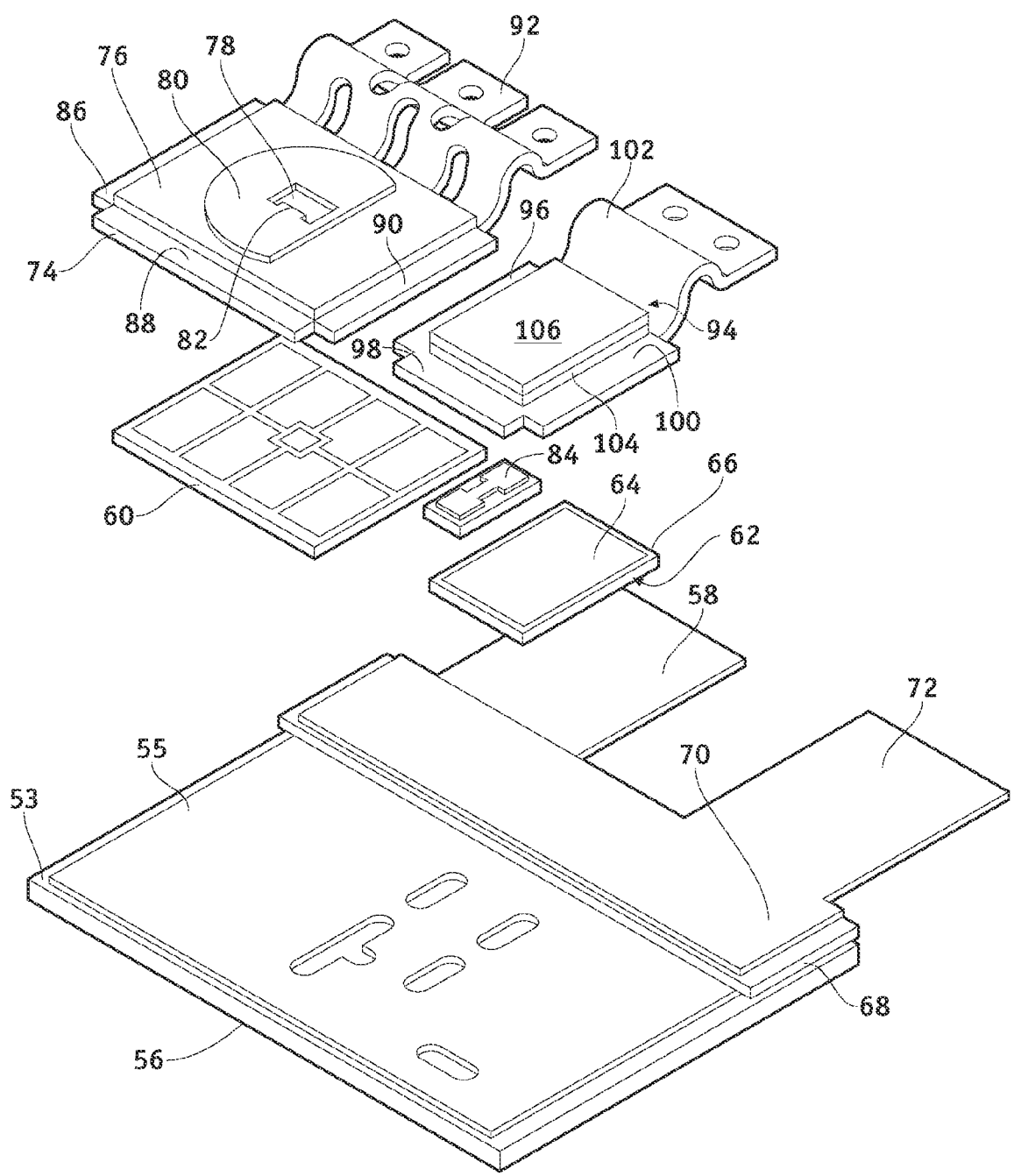
FIG. 4 is an exploded isometric view of the semiconductor device of FIG. 3.

FIG. 3 is an isometric view of one of the semiconductor devices 34 that can be utilized in the semiconductor module 20 illustrated in FIGS. 1 and 2 in accordance with one exemplary embodiment, and FIG. 4 is an exploded isometric view of the semiconductor device 34 of FIG. 3. The semiconductor device 34 includes a wafer 53, which is about 0.5-1 mm thick and about 25 mm long by about 19 mm wide, although larger or smaller sizes can also be provided, and has metal foil layers 55 and 56 bonded to opposite sides thereto. The wafer 53 is made of an insulating layer such as beryllium oxide, aluminum oxide, aluminum nitride, silicon nitride or boron nitride, while the foil layers 55 and 56 are copper or aluminum having a thickness of about 0.25 mm. Preferably, the foil layers 55 and 56 are directly bonded to the wafer 53. The foil layer 55 includes a tab 58 suitable for connecting the foil layer 55 to another component of the semiconductor module 20.

A second, but smaller, ceramic wafer 68 is bonded to the foil layer 55 of the wafer 53. A third copper foil member 70 is attached to the ceramic wafer 68 and has a second tab 72 extending therefrom. The second tab 72 is insulated from the first tab 58 by the ceramic wafer 68.

Figure 5:
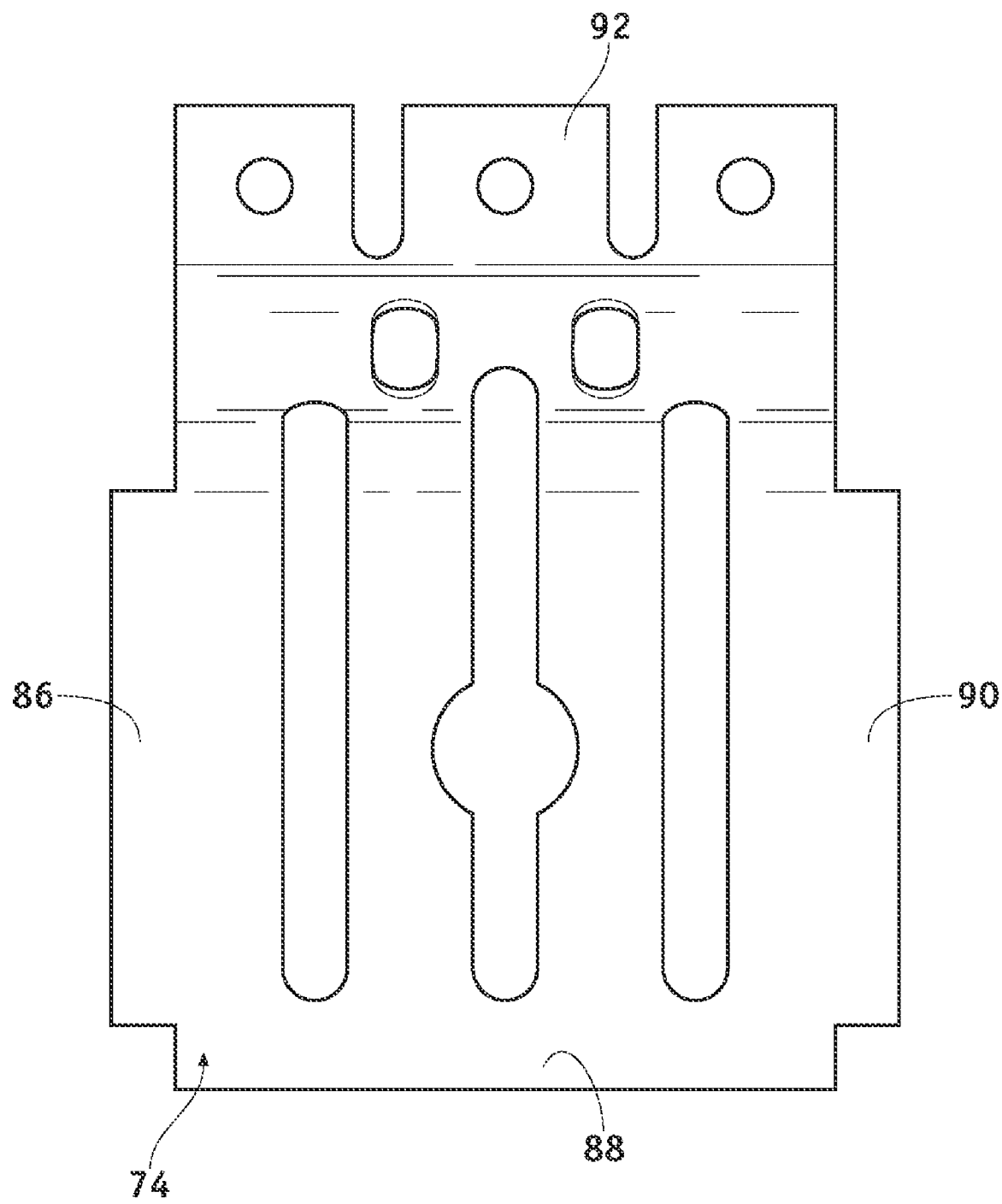
FIG. 5 is a plan view of an exemplary metal layer utilized in the semiconductor devices of FIGS. 1-4.

A silicon semiconductor switching transistor 60 (FIG. 4), such as an IGBT or MOSFET, is bonded or adhered to a first portion of the foil layer 55 of the wafer 53. A first metal layer 74 is soldered to the transistor 60 and includes a contact area 92 that serves as a conductor to the transistor 60. As used herein, the terms soldered, bonded, and attached are used in their broadest sense, and in various embodiments, can be used as interchangeable processes. FIG. 5 is a plan view of the first metal layer 74 removed from the semiconductor device 34. The first metal layer 74 can be copper, aluminum, gold, silver or beryllium. The transistor 60 can be any size, for example, 2 mm by 2 mm or 15 mm by 15 mm. Generally, in one embodiment, the transistor 60 can have a rectangular or square form factor, and the first metal layer 74 will be 1-3 mm larger in one or more linear direction than the transistor 60. A ceramic layer 76 having a window 78 is bonded to the first metal layer 74. A D-shaped disk 80 having a contact tab 82 projecting through the window 78 is attached to the ceramic layer 76 and is connected to a trimmable resistor 84.

The first metal layer 74 defines an area larger than the area of the area defined by the transistor 60, the area defined by the ceramic layer 76, and the area defined by the D-shaped disk 80. The first metal layer 74 includes a plurality of extended perimeter areas 86, 88, and 90. The contact area 92 can extend from one side of the first metal layer 74, and the extended perimeter areas 86, 88, and 90 can extend from the other three sides. The first metal layer 74 covers the switching transistor 60, and the extended perimeter areas 86, 88, and 90 extend beyond the transistor 60. The extended perimeter areas 86, 88, and 90 of the first metal layer 74 also extend beyond the ceramic layer 76 and the D-shaped disk 80. As such, when the semiconductor device 34 is cooled by the cooling system, the coolant fluid 38 directly contacts the extended perimeter areas 86, 88, and 90 of the first metal layer 74, which in turn, directly contacts the transistor 60. The extended perimeter areas 86, 88, and 90 provide a mechanism by which the coolant fluid 38 can wick heat from the transistor 60 more effectively. As noted above, the extended perimeter areas 86, 88, and 90 can extend 1-3 mm from the perimeter of the transistor 60 and/or the ceramic layer 76. Although the size of the extended perimeter areas 86, 88, and 90 can be constrained by the size of the semiconductor device 34, the larger the surface area of the extended perimeters areas 86, 88, and 90, the better the cooling of the transistor 60. In an alternate embodiment, the first metal layer 74 is substantially rectangular, although the surface area of the first metal layer 74 is larger than the transistor 60 and the ceramic layer 76.

A fast silicon semiconductor diode (SFD) 62 is bonded to a second portion of the foil layer 55. The SFD 62 provides a blocking diode for the transistor 60 and is preferably made of a material substantially similar to the transistor 60. A diode contact area 64 and ceramic wafer 66 form part of the SFD 62. A second metal layer 94 is positioned over the SFD 62, and a ceramic layer 104 is positioned over the second metal layer 94. The second metal layer 94 further defines an area larger than the area defined by the SFD 62 and the area defined by the ceramic layer 104. The second metal layer 94 includes a contact area 102 that serves as a conductor to the SFD 62. The second metal layer 94 includes a plurality of extended perimeter areas 96, 98, and 100. The contact area 102 can extend from one side of second metal layer 94 and the extended perimeter areas 96, 98, and 100 can extend from the other three sides. The second metal layer 94 covers the SFD 62, and the extended perimeter areas 96, 98, and 100 extend beyond the SFD 62. The extended perimeter areas 96, 98, and 100 of the second metal layer 94 also extend beyond the ceramic layer 104. A third metal layer 106 may be attached to the top side of ceramic wafer 104. The metal layer 106 can serve to balance the mismatch of coefficients of expansions to prevent a bi-metallic spring affect. As such, when the semiconductor device 34 is cooled by the cooling system, the coolant fluid 38 directly contacts the extended perimeter areas 96, 98, and 100 of the second metal layer 94, which in turn, directly contacts the SFD 62. The extended perimeter areas 96, 98, and 100 provide a mechanism by which the coolant fluid 38 can wick heat from the SFD 62 more effectively. The extended perimeter areas 96, 98, and 100 can extend, for example, 1-3 mm. Although the size of the extended perimeter areas 96, 98, and 100 can be constrained by the size of the semiconductor device 34, the larger the surface area of the extended perimeters areas 96, 98, and 100, the better the cooling of the SFD 62. In an alternate embodiment, the second metal layer 94 is substantially rectangular, although the surface area of the first metal layer 94 is larger than the SFD 62 and the ceramic layer 104. Generally, the size of the second metal layer 94 is driven by the semiconductor geometry.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor device, comprising:
    a wafer having first and second opposed metallized major faces;
    a transistor bonded to the first metallized face of the wafer, wherein the transistor includes a first surface, and wherein the first surface defines a first area;
    a first metal layer bonded to the first surface of the transistor, wherein the first metal layer has a first surface that defines a second area larger than the first area of the transistor, wherein the first metal layer has a plurality of extended perimeter areas, the plurality of extended perimeter areas including a first extended perimeter area extending from a first side of the first metal layer and forming a contact, a second extended perimeter area extending from a second side of the first metal layer, and a third extended perimeter area extending from a third side of the first metal layer; and
    a ceramic layer bonded to the first surface of the first metal layer.

2. The semiconductor device of claim 1, wherein the ceramic layer has a first surface that defines a third area smaller than the second area of the first metal layer.

3. The semiconductor device of claim 1, wherein the plurality of extended perimeter areas includes a fourth extended perimeter area extending from a fourth side of the first metal layer.

4. The semiconductor device of claim 1, further comprising:
    a diode disposed adjacent to the transistor, bonded to the first metallized face of the ceramic wafer, and having a first surface defining a first area,
    a second metal layer bonded to the first surface of the diode and having a first surface defining a second area; and
    a second ceramic layer bonded to the first surface of the second metal layer and having a first surface defining a third area, wherein the second area of the first surface of the second metal layer is greater than the first area of the first surface of the diode.

5. The semiconductor device of claim 4, wherein the second area of the first surface of the second metal layer is greater than the third area of the first surface of the second ceramic layer.

6. The semiconductor device of claim 4, wherein the second metal layer has a plurality of extended perimeter areas.

7. The semiconductor device of claim 6, wherein the second metal layer has a contact area extending from a first side, and wherein the plurality of extended perimeter areas includes a first extended perimeter area extending from a second side, a second extended perimeter area extending from a third side, and a third extended perimeter area extending from a fourth side.

8. The semiconductor device of claim 1, wherein the transistor is an insulated gate bipolar transistor (IGBT).

9. A semiconductor module, comprising:
a housing having a cavity therein;
at least one semiconductor device residing within the cavity, wherein the at least one semiconductor device comprises:
a wafer having first and second opposed metallized major faces;
a transistor bonded to the first metallized face of the wafer, wherein the transistor includes a first surface, and wherein the first surface defines a first area;
a first metal layer bonded to the first surface of the transistor, wherein the first metal layer has a first surface that defines a second area larger than the first area of the transistor, wherein the first metal layer has a plurality of extended perimeter areas, the plurality of extended perimeter areas including a first extended perimeter area extending from a first side of the first metal layer and forming a contact, a second extended perimeter area extending from a second side of the first metal layer, and a third extended perimeter area extending from a third side of the first metal layer;
a ceramic layer bonded to the first metal layer; and
a cooling system comprising:
a flow passageway through the housing and fluidly coupled to the cavity, wherein said cooling system is configured to circulate a coolant fluid through said the flow passageway and in contact with the first metal layer of the at least one semiconductor device.

10. The semiconductor module of claim 9, wherein the ceramic layer has a first surface that defines a third area smaller than the second area of first metal layer.

11. The semiconductor module of claim 9, wherein the cooling system is configured to contact the plurality of extended perimeter areas with the coolant fluid.

12. The semiconductor module of claim 11, wherein the first metal layer has a fourth extended perimeter area extending from a fourth side of the first metal layer.

13. The semiconductor module of claim 9, further comprising:
a diode disposed adjacent to the transistor, bonded to the first metallized face of the ceramic wafer, and having a first surface defining a first area,
a second metal layer bonded to the a first surface of the diode and having a first surface defining a second area, and
a second ceramic layer bonded to the first surface of the second metal layer and having a first surface defining a third area, wherein the second area of the first surface of the second metal layer is greater than the first area of the first surface of the diode, and wherein the cooling system is further configured to contact the second metal layer of the at least one semiconductor device with the coolant fluid.

14. The semiconductor module of claim 13, wherein the second area of the first surface of the second metal layer is greater than the third area of the first surface of the second ceramic layer.

15. The semiconductor module of claim 13, wherein the second metal layer has a plurality of extended perimeter areas, and wherein the cooling system is configured to deliver the coolant fluid in contact with the plurality of extended perimeter areas of the second metal layer.

16. The semiconductor module of claim 15, wherein the second metal layer has a contact area extending from a first side, and wherein the plurality of extended perimeter areas includes a first extended perimeter area extending from a second side, a second extended perimeter area extending from a third side, and a third extended perimeter area extending from a fourth side.

17. A method for cooling a semiconductor device with a first metal layer bonded to a transistor, the first metal layer having at least three sides with extended perimeter areas, the method comprising the steps of:
circulating a coolant fluid through a flow passageway;
directing the coolant fluid onto the extended perimeter areas on the at least three sides of the first metal layer of the semiconductor device; and
collecting the coolant fluid and recirculating the coolant fluid through the flow passageway.

18. The method of claim 17, wherein semiconductor device further comprises a second metal layer bonded to a diode disposed adjacent to the transistor, the second metal layer having at least two sides with extended perimeter areas, and wherein the method further comprises the step of directing the coolant fluid additionally onto the extended perimeter areas on the at least two sides of the second metal layer.

19. The semiconductor device of claim 6, wherein the second metal layer has a contact area extending from a first side of the second metal layer, and wherein the plurality of extended perimeter areas includes a first extended perimeter area extending from a second side of the second metal layer, and a second extended perimeter area extending from a third side of the second metal layer.

20. The semiconductor module of claim 15, wherein the second metal layer has a contact area extending from a first side of the second metal layer, and wherein the plurality of extended perimeter areas includes a first extended perimeter area extending from a second side of the second metal layer, and a second extended perimeter area extending from a third side of the second metal layer.

* * * * *